United States Patent
Kim (10) Patent No.: US 8,704,307 B2
(45) Date of Patent: Apr. 22, 2014

(54) DEVICE FOR ELECTROSTATIC DISCHARGE PROTECTION COMPRISING TRIPLE-DIFFUSED DRAIN STRUCTURE

(75) Inventor: Kil Ho Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 187 days.

(21) Appl. No.: 11/159,898

(22) Filed: Jun. 23, 2005

(65) Prior Publication Data
US 2005/0285200 A1 Dec. 29, 2005

(30) Foreign Application Priority Data
Jun. 29, 2004 (KR) .................. 10-2004-0049756

(51) Int. Cl.
*H01L 23/60* (2006.01)
(52) U.S. Cl.
USPC ............... 257/355; 257/401; 257/E29.024; 257/E29.268; 257/E21.435
(58) Field of Classification Search
USPC ........... 257/355, E29.024, E29.027, E21.435, 257/E29.268, E29.279, 401, 512, E27.028, 257/E21.62
See application file for complete search history.

(56) References Cited

U.S. PATENT DOCUMENTS

| | | | |
|---|---|---|---|
| 4,990,982 A * | 2/1991 | Omoto et al. ................. | 257/409 |
| 5,086,365 A * | 2/1992 | Lien ................................ | 361/58 |
| 5,217,910 A * | 6/1993 | Shimizu et al. ................ | 438/231 |
| 5,229,308 A * | 7/1993 | Vo et al. ......................... | 438/234 |
| 5,496,751 A * | 3/1996 | Wei et al. ....................... | 438/302 |
| 5,646,054 A * | 7/1997 | Rhee .............................. | 438/507 |
| 6,218,226 B1 * | 4/2001 | Lin et al. ........................ | 438/200 |
| 6,278,162 B1 * | 8/2001 | Lien et al. ...................... | 257/408 |
| 6,677,210 B1 * | 1/2004 | Hebert ............................ | 438/301 |
| 6,858,902 B1 * | 2/2005 | Salling et al. .................. | 257/360 |

FOREIGN PATENT DOCUMENTS

KP   10-2003-0073403     9/2003

* cited by examiner

*Primary Examiner* — Matthew Reames
*Assistant Examiner* — Christopher M Roland
(74) *Attorney, Agent, or Firm* — NSIP Law (57) ABSTRACT

Disclosed herein is a device for electrostatic discharge protection. According to the present invention, the device for electrostatic discharge protection comprises a semiconductor substrate, a plurality of element isolation films formed in predetermined regions on the semiconductor substrate, a gate formed in a predetermined region on the semiconductor substrate between the element isolation films, a well pick-up region formed in a predetermined region on the semiconductor substrate between the element isolation films, a source formed in a predetermined region on the semiconductor substrate between the element isolation film and the gate, and drains of a triple structure, which are formed in a predetermined region on the semiconductor substrate between the gate and the element isolation film. Furthermore, the gate, the well pick-up region and the source are connected to a ground line, and the drain is connected to a power line. Accordingly, a stable and good ESD protection performance can be implemented.

27 Claims, 11 Drawing Sheets
(4 of 11 Drawing Sheet(s) Filed in Color)

FIG. 13

DEVICE FOR ELECTROSTATIC DISCHARGE PROTECTION COMPRISING TRIPLE-DIFFUSED DRAIN STRUCTURE

CROSS-REFERENCE TO RELATED APPLICATION

This application claims the benefit under 35 U.S.C. §119(a) of Korean Patent Application No. 10-2004-0049756 filed on Jun. 29, 2004, in the Korean Intellectual Property Office, the entire disclosure of which is incorporated herein by reference for all purposes.

BACKGROUND

1. Field of the Invention

The present invention relates to a device for electrostatic discharge protection, and more specifically to a device for electrostatic discharge protection, which can protect a microchip from electrostatic discharge in fabricating the microchip that operates a high voltage.

2. Discussion of Related Art

Figure 1:
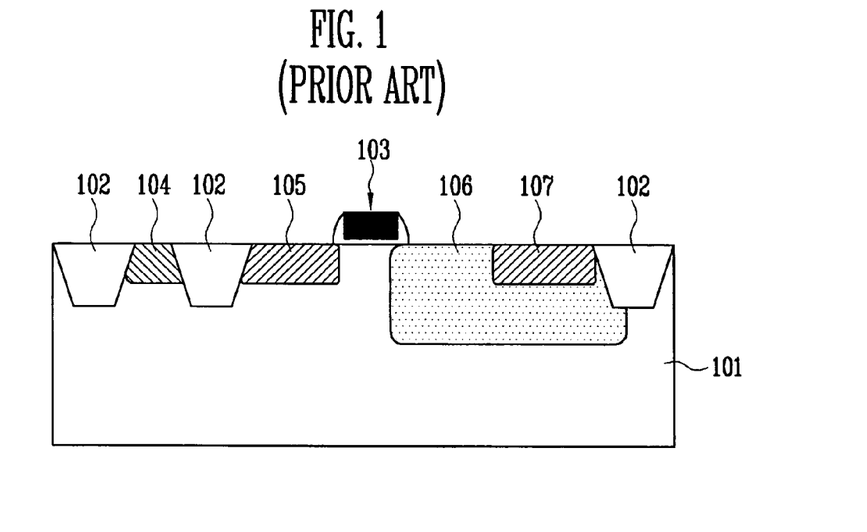
FIG. 1 is a cross-sectional view of a conventional DDDNMOS device that operates at high voltage.

One of the basic characteristics that a semiconductor device operating at high voltage must have is that an avalanche breakdown voltage must be higher than an operating voltage. In order to satisfy this characteristic, a N-type MOSFET adopting the drain in which a dopant is diffused twice, as shown in FIG. 1, so-called DDDNMOS (Double Diffused Drain N-type MOSFET) is used as a basic element.

The construction of the DDDNMOS device will now be described with reference to FIG. 1. A plurality of element isolation films 102 are formed in predetermined regions on a semiconductor substrate 101 in which a P well is formed. A gate 103 is formed over the semiconductor substrate 101 between the element isolation films 102. A well pick-up region 104 is formed on the semiconductor substrate 101 between the element isolation film 102s by means of a high-concentration P-type impurity ion implant process. A source active region 105 is formed on the semiconductor substrate 101 between the element isolation film 102 and the gate 103 by means of a high-concentration N-type impurity ion implant process. Furthermore, a drain is formed between the gate 103 and the element isolation film 102 by means of a dual N-type impurity ion implant process. The drain has a drain active region 107 of a high concentration formed within a drain drift region 106 of a low concentration. In this time, the drain active region 107 is formed by implanting an N-type impurity of a sufficient high concentration, e.g., at a dose of $10^{15}$ to $10^{16}$ cm$^{-2}$. The drain drift region 106 is formed by implanting an N-type impurity of a concentration lower than that of the drain active region 107, e.g., at a dose of $10^{13}$ cm$^{-2}$. In most cases, since the source active region 105 is formed simultaneously with the drain active region 107 by means of an impurity implant process, the impurity concentration of the source active region 105 is the same as those of the drain active region 107. Furthermore, the P well below the gate 103 constituting a channel is formed by implanting an impurity of a concentration lower than that of the drain drift region 106, e.g., at a dose of $10^{12}$ cm$^{-2}$.

Generally, the lower the impurity concentrations of two regions, which are in contact with each other with an electrically opposite polarity, the higher the avalanche breakdown voltage. Accordingly, if the structure such as the DDDNMOS device is adopted, the impurity concentration of the drain drift region that is in contact with the P well region can be sufficiently lowered. It is thus possible to implement a breakdown voltage of a desired degree.

Figure 2:
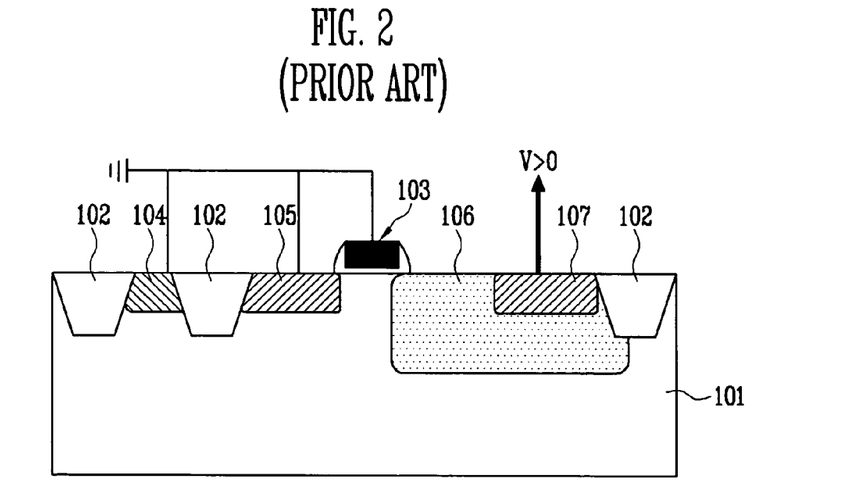
FIG. 2 shows the construction of a GG_DDDNMOS device in which the conventional DDDNMOS device is used as a device for ESD protection.

In order for a DDDNMOS device operating at high voltage to be used as a device for ESD protection, the gate 103, the source 105 and the well pick-up region 104 are all connected to a ground line Vss, and the drain 107 is connected to a power line or an individual I/O pad, as shown in FIG. 2. In a GG_DDDNMOS (Gate Grounded DDDNMOS) having the electrodes constructed as above, if a voltage applied to the drain 107 is lower than a breakdown voltage, current rarely flows. On the contrary, if the voltage applied to the drain 107 is lower than the avalanche breakdown voltage, an impact ionization phenomenon is generated at the boundary where the semiconductor substrate 101 and the drain drift region 106 meet, so that a number of electrical carriers are formed. As a result, a parasitic NPN-BJT (Bipolar Junction Transistor) is formed, and a large amount of current thus flows between the drain 107 and the source 105. Consequently, in the GG_DDDNMOS having the electrodes constructed as above, current rarely flows at a voltage lower than an avalanche breakdown voltage, and current smoothly flows at a voltage higher than an avalanche breakdown voltage. Thus, the GG_DDDNMOS satisfies a basic characteristic that can be used as a device for ESD protection, which can digest undesired stress current in an electrostatic discharge situation and thus protect internal circuits.

Figure 3:
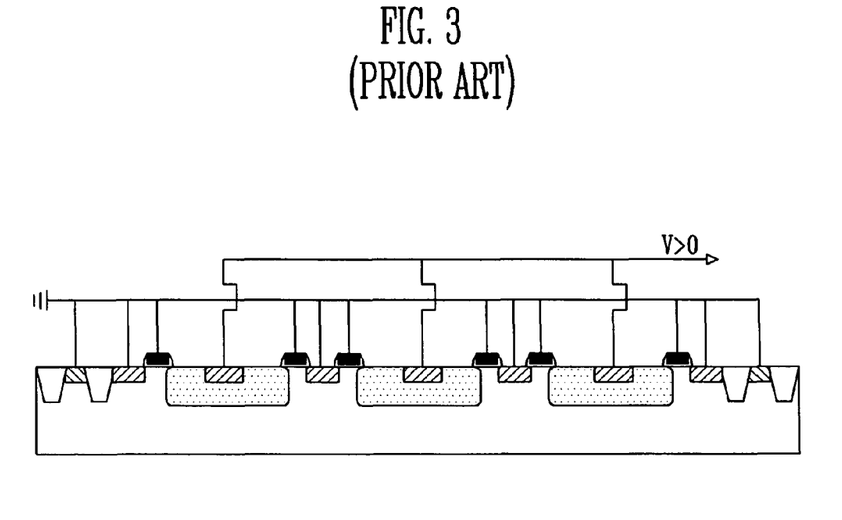
FIG. 3 shows a multi-finger structure of a conventional GG_DDDNMOS device.

Meanwhile, in order to increase the amount of ESD stress current that the device can digest, a GG_DDDNMOS device of a multi-finger structure in which a plurality of the GG_DDDNMOS devices of the single-finger structure as shown in FIG. 2 are connected in parallel, as shown in FIG. 3 is used.

Figure 4A:
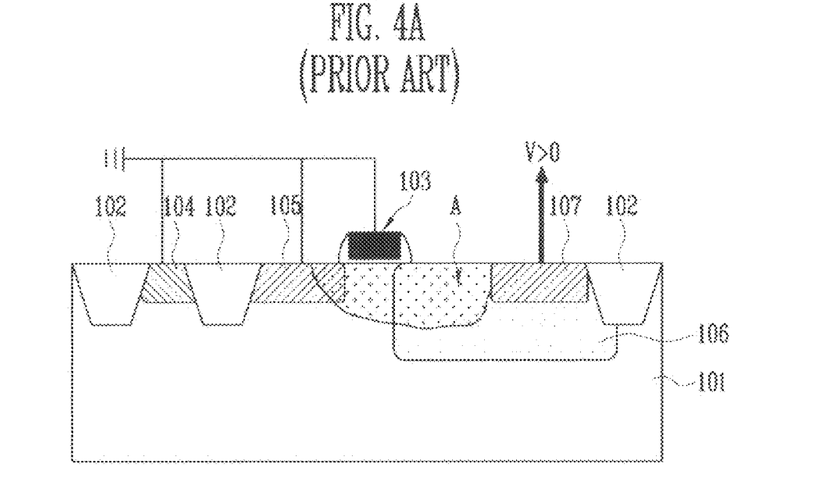
FIGS. 4(a) and 4(b) illustrate a current path of the conventional GG_DDDNMOS device.
Figure 4B:
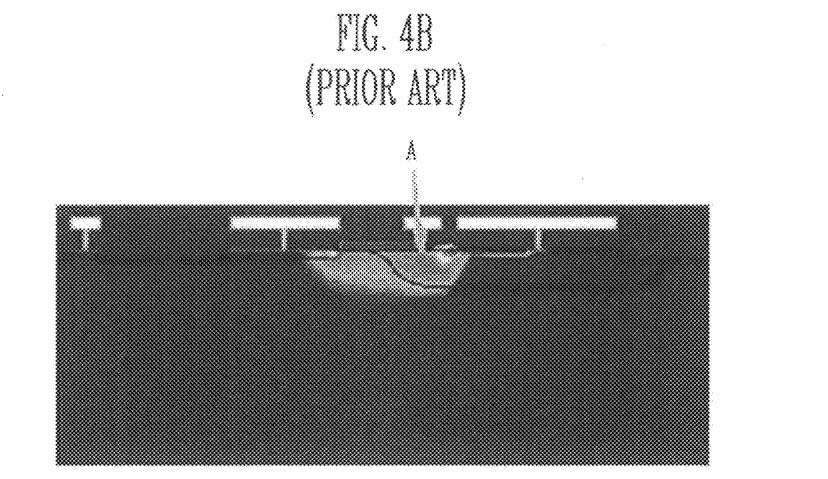

If the parasitic NPN-BJT is formed in the GG_DDDNMOS device and a high current thus starts to flow, there is a characteristic in that an extremely low resistive current path A, which connects the drain, the channel and the source, is formed along the surface of the device, as shown in FIGS. 4(a) and 4(b). Such a surface concentration phenomenon of current serves to degrade the ability of coping with ESD stress current of a GG_DDDNMOS device. More particularly, since electrical resistance of the current path is very low, a thermal breakdown voltage of the GG_DDDNMOS device becomes lower than a BJT triggering voltage. Consequently, there occurs a problem in that stabilized multi-finger triggering is difficult to implement. As such, if the current path is limitedly formed along the surface of the device and current is thus concentrated on the surface of the device, a temperature on the surface of the device sharply increases and a thermal breakdown phenomenon is generated on the surface of the surface accordingly.

Figure 5A:
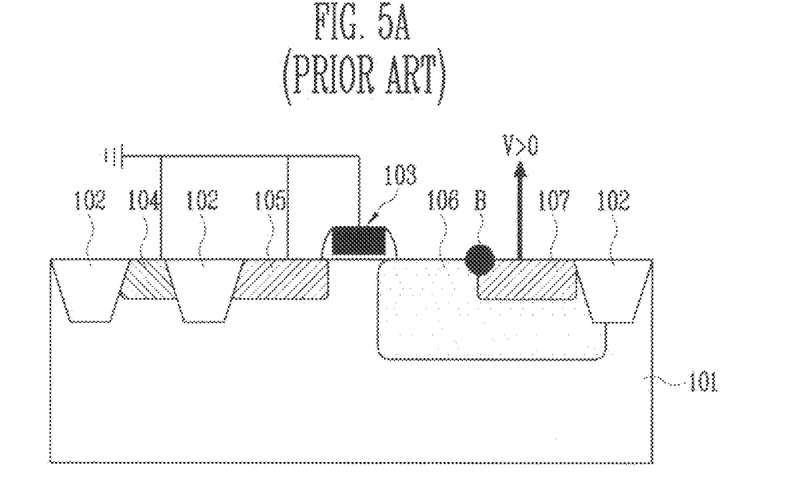
FIGS. 5(a) and 5(b) illustrate a thermal breakdown point of the conventional GG_DDDNMOS device.
Figure 5B:
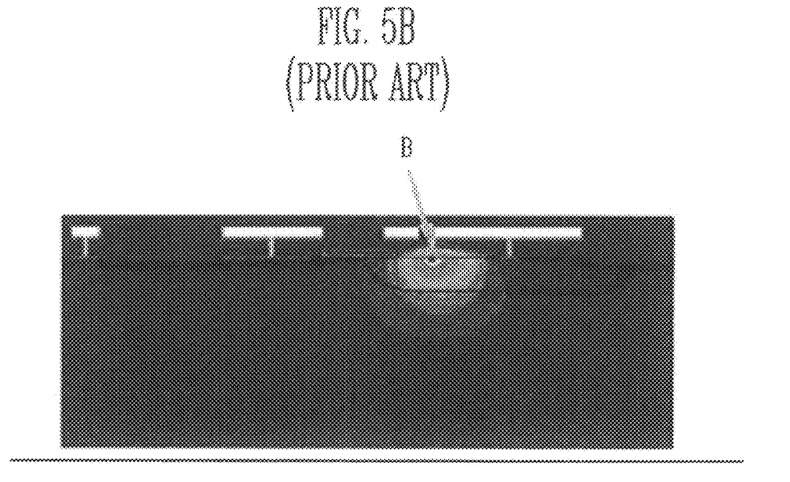

It was found through simulation that a temperature in a very limited region on the surface of the boundary of the drain active region 107 and the drain drift region 106 sharply rises to generate a thermal breakdown phenomenon B, as shown in FIGS. 5(a) and 5(b). That is, since current flows on the surface of the surface very limitedly and most of a voltage applied between the drain active region 107 and the source active region 105 is applied on the boundary of the drain active region 107 and the drain drift region 106, a highest temperature region (or thermal breakdown point) is very limited. As such, if the highest temperature region is limitedly distributed at a narrow region, a temperature in the region relatively rapidly rises even a low stress current. Thus, the ability of a device to cope with stress current is lowered.

Figure 6A:
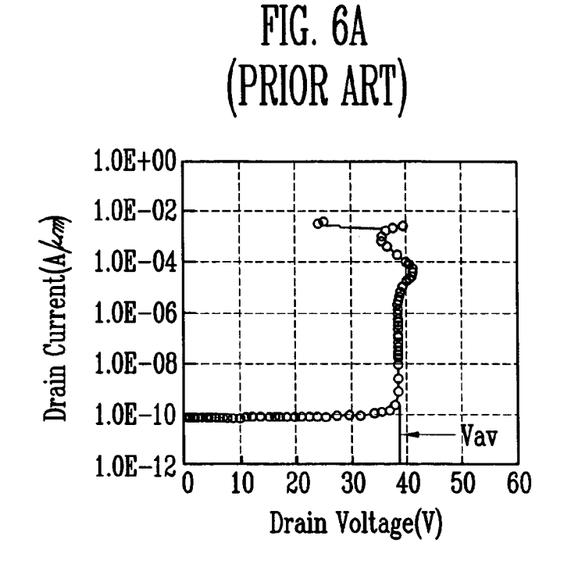
FIGS. 6(a) and 6(b) are a voltage-current characteristic curve of the conventional GG_DDDNMOS device.
Figure 6B:
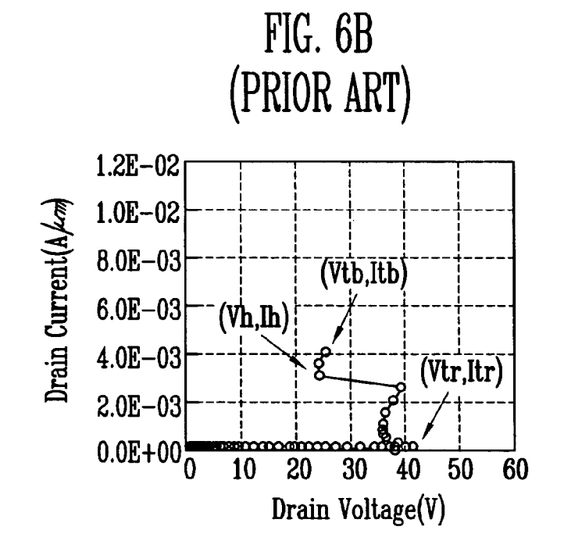

FIGS. 6(a) and 6(b) show a typical voltage-current characteristic when the GG_DDDNMOS device operates a device for ESD protection. When evaluated in terms of a design window of a device for ESD protection, the GG_DDDNMOS device cannot be used as the device for ESD protection due to the following several problems.

(1) A GG_DDDNMOS device itself is not sufficiently strong against stress current. That is, it could not cope with a sufficient large amount of stress current (Itb≤4 mA/μm).

(2) A GG_DDDNMOS device has a thermal breakdown voltage lower than a BJT triggering voltage (Vtr≥Vtb). Consequently, since each finger does not uniformly operates in a multi-finger structure, it is impossible to increase the ability of the GG_DDDNMOS device to cope with ESD stress even if the number of a finger is increased.

Consequently, in order to effectively perform ESD protection of a microchip that operates at high voltage, it is necessary to develop a device for ESD protection, which can solve those problems of the GG_DDDNMOS device while representing a characteristic of a high avalanche breakdown voltage. More particularly, in order to implement this object, there is a need for a method in which concentration of current, which occurs on the surface of a device, can be mitigated so that stress current can be uniformly distributed over the device.

SUMMARY OF THE INVENTION

Accordingly, the present invention has been made in view of the above problems, and it is an object of the present invention to provide a device for ESD protection, which can solve problems of a GG_DDDNMOS device while representing a characteristic of a high avalanche breakdown voltage.

Another object of the present invention is to provide a device for ESD protection, which can mitigate concentration of current, which occurs on the surface of a device, so that stress current can be uniformly distributed over the device.

Still another object of the present invention is to provide a device for ESD protection, which can freely control an avalanche breakdown voltage while securing a stable ESD protection characteristic, by forming a triple-diffused drain with different implant concentration and implant energy.

To achieve the above objects, according to an aspect of the present invention, there is provided a device for electrostatic discharge protection, comprising: a semiconductor substrate, a plurality of element isolation films formed in predetermined regions on the semiconductor substrate, a gate formed in a predetermined region on the semiconductor substrate between the element isolation films, a well pick-up region formed in a predetermined region on the semiconductor substrate between the element isolation films, a source formed in a predetermined region on the semiconductor substrate between the element isolation film and the gate, and drains of a triple structure, which are formed in a predetermined region on the semiconductor substrate between the gate and the element isolation film.

The gate, the well pick-up region and the source are connected to a ground line, and the drain is connected to a power line.

The drain comprises a drain drift region formed on the semiconductor substrate between the gate and the element isolation film, a drain active region, which is formed within the drain drift region and having a concentration higher than that of the drain drift region, and a drain impurity region, which completely includes the drain active region and is formed to be contained within the drain drift region.

The drain active region is formed by implanting an N-type impurity in a dose of $10^{15}$ to $10^{16}$ cm$^{-2}$, and the drain drift region is formed by implanting an N-type impurity in a dose of $10^{13}$ cm$^{-2}$.

The drain impurity region is formed using an impurity concentration, which is higher than an impurity ion implant concentration for forming the drain drift region, but lower than an impurity concentration for forming the drain active region.

The drain impurity region is formed by performing an ion implant process with energy, which is higher than that of ion implant processes for forming the drain drift region and the drain active region.

The drain impurity region is formed so that a distance where an impurity concentration of the edge of the drain drift region is not changed due to diffused impurity of the drain impurity region in a thermal drive-in process is secured, regarding the direction where the gate is formed.

The drain comprises the drain drift region, the drain active region, the impurity region, and an overlapping region of the drain drift region and the impurity region impurity implant concentrations of which are different.

The source comprises a source active region, which is formed using the same impurity implant concentration and energy as those of the drain active region.

The source further comprises a source impurity region that is formed not to exceed the source active region.

The source impurity region is formed using the same impurity concentration and energy as those of the drain impurity region.

According to another aspect of the present invention, there is provided a device for electrostatic discharge protection, comprising: a semiconductor substrate, a plurality of element isolation films formed in predetermined regions on the semiconductor substrate, a gate formed in a predetermined region on the semiconductor substrate between the element isolation films, a well pick-up region formed in a predetermined region on the semiconductor substrate between the element isolation films, a source active region formed in a predetermined region on the semiconductor substrate between the element isolation film and the gate, an source impurity region formed not to exceed the source active region, a drain drift region formed on the semiconductor substrate between the gate and the element isolation film, a drain active region, which is formed within the drain drift region and has a concentration higher than that of the drain drift region, and a drain impurity region, which completely includes the drain active region and is formed to be confined within the drain drift region.

DETAILED DESCRIPTION OF PREFERRED EMBODIMENTS

Now, the preferred embodiments according to the present invention will be described with reference to the accompanying drawings.

Figure 7:
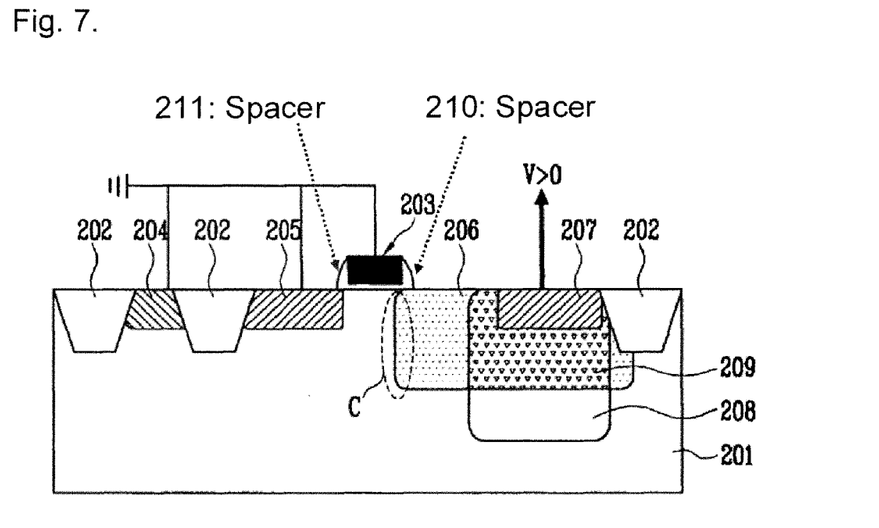
FIG. 7 shows the construction of a GG_TDDNMOS device which is used as a device for ESD protection device according to the present invention.

FIG. 7 shows the construction of a GG_TDDNMOS (Grounded Gate Triple Diffused Drain N-type MOSFET) device in which electrodes are connected to a N-type MOSFET using the drain into which an impurity is diffused in triple, so-called a TDDNMOS (Triple Diffused Drain N-type MOSFET) device according to the present invention.

Referring to FIG. 7, a plurality of element isolation films 202 are formed in predetermined regions on a semiconductor substrate 201 in which a P well is formed. A gate 203 is formed on the semiconductor substrate 201 between element isolation films 202. A well pick-up region 204 is formed on the semiconductor substrate 201 between element isolation films 202 by means of a high-concentration P-type impurity ion implant process. A source active region 205 is formed on the semiconductor substrate 201 between the element isolation film 202 and the gate 203 by means of a high-concentration N-type impurity ion implant process. Furthermore, a drain is formed between the gate 203 and the element isolation film 202 by means of a dual N-type impurity ion implant process. The drain has a drain active region 207 of a high concentration formed within a drain drift region 206 of a low concentration. An impurity region 208, which completely includes the drain active region 207, is formed so that it is limited within the drain drift region 206. In this time, the drain active region 207 is formed by implanting an N-type impurity of a sufficient high concentration, e.g., in a dose of $10^{15}$ to $10^{16}$ cm$^{-2}$. The drain drift region 206 is formed by implanting an N-type impurity of a concentration relatively lower than that of the drain active region 207, e.g., in a dose of $10^{13}$ cm$^{-2}$. Furthermore, in most cases, since the source active region 205 is formed simultaneously with the drain active region 207 by means of an impurity implant process, the impurity concentration of the source active region 205 is the same as that of the drain active region 207. Moreover, the P well under the gate 203, which forms a channel, is formed by implanting an impurity of a concentration lower than that of the drain drift region 206, e.g., in a dose of $10^{12}$ cm$^{-2}$. The gate 203, the well pick-up region 204 and the source 205 are all connected to a ground line Vss, and the drain is connected to a power line or an individual I/O pad, thus implementing a GG_TDDNMOS device.

Meanwhile, the impurity region 208, which is the structure forming the TDDNMOS device according to the present invention, has an impurity concentration set similar to or slightly higher than an N-type impurity ion implant dose for forming the drain drift region 206. However, an absolute value of the impurity concentration in the impurity region 208 is set not to exceed $10^{14}$ cm$^{-2}$. Furthermore, the impurity region 208 is formed by performing the ion implant process at an energy level sufficiently higher than that of the ion implant process for forming the drain drift region 206. For example, if the drain drift region 206 is formed by implanting an impurity in a dose of $2 \times 10^{13}$ cm$^{-2}$ and the drain active region 207 is formed by implanting an impurity in a dose of $2 \times 10^{15}$ cm$^{-2}$, the impurity region 208 is formed by implanting an impurity in a dose of $7 \times 10^{13}$ cm$^{-2}$. More particularly, regarding the direction where the gate 203 is formed, the impurity region 208 is formed so that a distance between the edge of the drain drift region 206 and the edge of the impurity region 208 is sufficiently secured. Furthermore, the process for forming the impurity region 208 is performed so that thermal drive-in is minimized. That is, it is required that the impurity concentration of the lateral edge C of the drain drift region 206 be not changed due to excessive diffusion of an impurity by means of the thermal drive-in process, which is performed after the impurity region 208 is formed.

Figure 8:
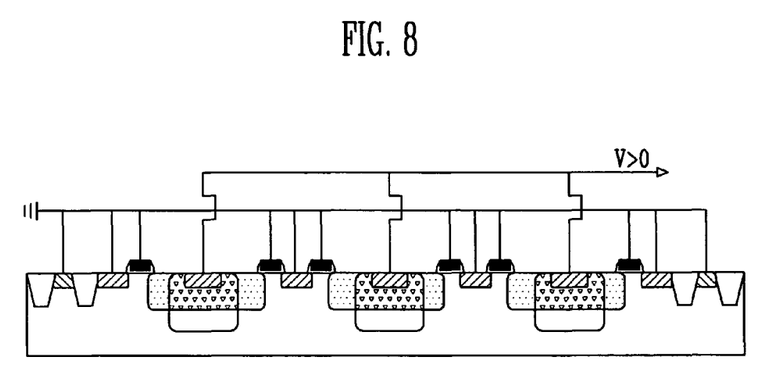
FIG. 8 shows a multi-finger structure of the GG_TDDNMOS device according to the present invention.

The drain of the TDDNMOS device formed thus results in four regions having different impurity implant concentrations, i.e., the drain drift region 206, the drain active region 207, the impurity region 208, and an overlapping region 209 of the drain drift region 206 and the impurity region 208. In this time, relative impurity concentrations of the respective regions have the relationship of 207>209>208≥206 or 207>209>206≥208. That is, the impurity concentration of the overlapping region 209 can be made always higher than that of the drain drift region 206, and the impurity concentration of the impurity region 208 can be made almost similar to that of the drain drift region 206. Furthermore, the impurity concentration of the drain drift region 206, more particularly, the impurity concentration of the lateral edge C is the same as that of a corresponding region of an existing GG_DDDNMOS. FIG. 8 shows a multi-finger structure in which the GG_TDDNMOS device of the single-finger structure is connected in parallel in plural.

In the GG_TDDNMOS device where the gate 203, the source 205 and the well pick-up region 204 are connected to the ground line Vss line together, the impurity concentration of the impurity region 208 is almost the same as that of the drain drift region 206 because electric field is strongly applied along the lateral direction of the device. Thus, an avalanche breakdown voltage of the GG_TDDNMOS device is dependent upon an impurity concentration of the drain drift region 206, more particularly, an impurity concentration of the lateral edge C of the drain drift region 206. Consequently, the avalanche breakdown voltage of the GG_TDDNMOS device becomes the same as that of an existing GG_DDDNMOS device.

Figure 9A:
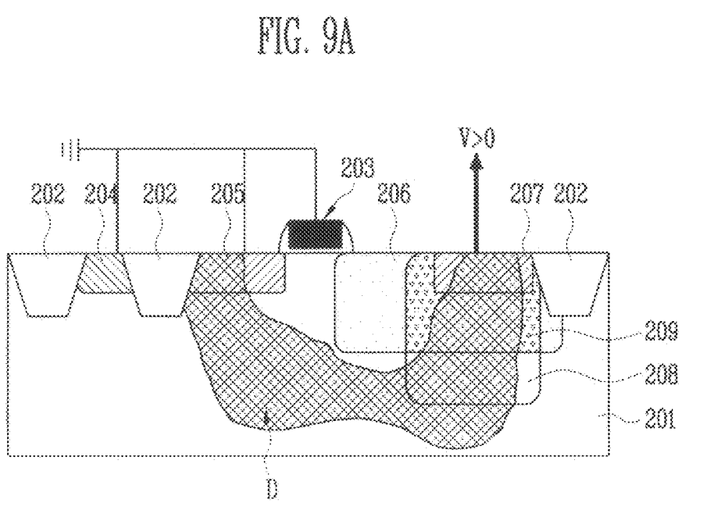
FIGS. 9(a) and 9(b) illustrate a current path of the GG_TDDNMOS device according to the present invention.
Figure 9B:
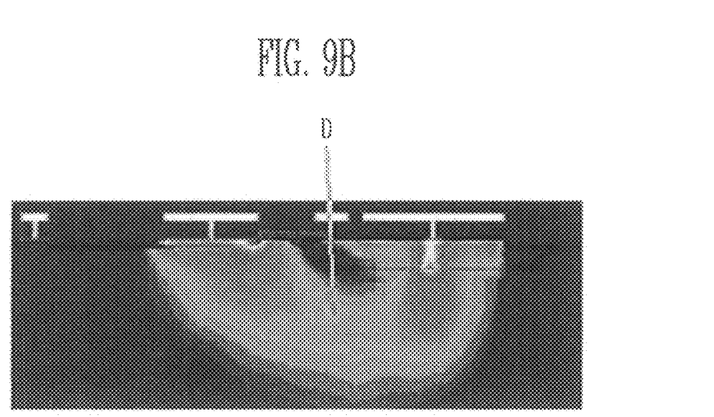

Current paths along which current mainly flows when the GG_TDDNMOS device proposed by the present invention operates a device for ESD protection are shown in FIGS. 9(a) and 9(b). In the case of a device for ESD protection, which employs the GG_TDDNMOS device, a current path D of an U shape, which is formed in the depth direction of the device due to an effect of the ion implant process that is additionally performed on the overlapping region 209 and the impurity region 208, keeps intact. Accordingly, since current is not concentrated, the GG_TDDNMOS device can cope with a great amount of ESD stress current compared with the GG_DDDNMOS device.

Figure 10A:
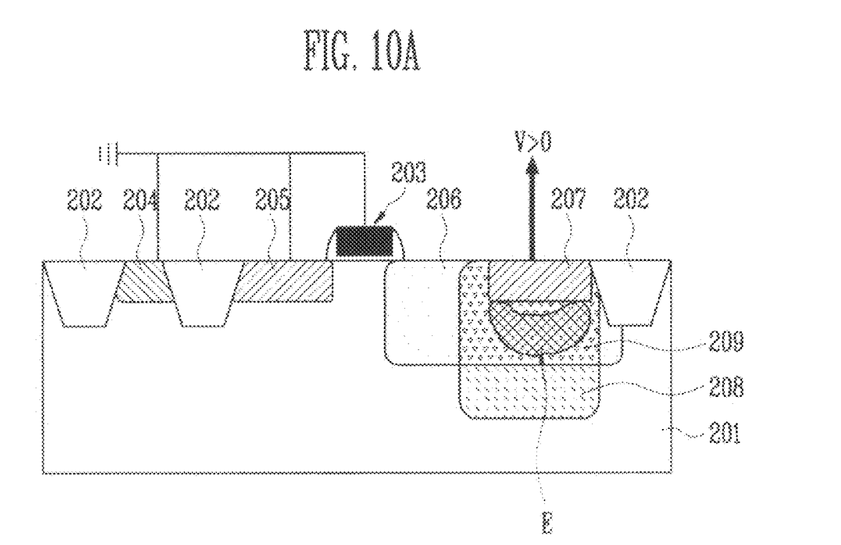
FIGS. 10(a) and 10(b) illustrate a thermal breakdown point of the GG_TDDNMOS device according to the present invention.
Figure 10B:
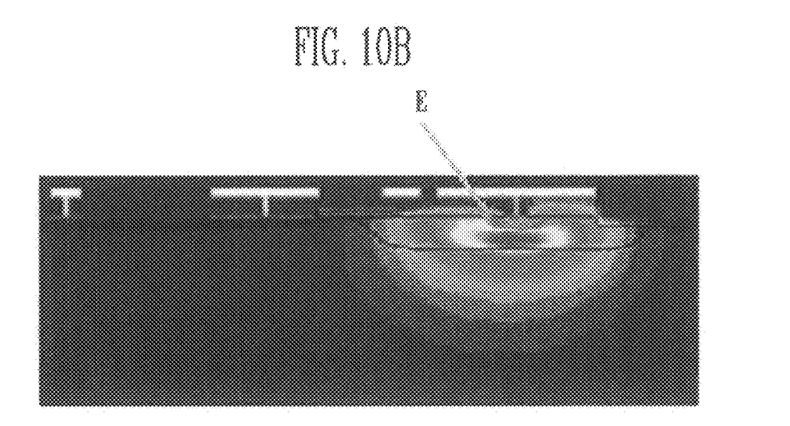

Stress current increases when the GG_TDDNMOS device proposed by the present invention operates as a device for ESD protection. Thus, the location where thermal breakdown occurs is not concentrated on the surface of the device is distributed over a wide area in the depth direction of the device since current is not concentration on the surface of the device. (See FIGS. 10(a) and 10(b)). It was found through simulation that a highest temperature region or a thermal breakdown point E is located widely along the bottom direction of the drain active region 207. If the highest temperature region or the thermal breakdown point E is distributed over a wide area as such, a temperature in the region relatively slowly rises. Consequently, the ability of a device to cope with stress current is improved.

Figure 11A:
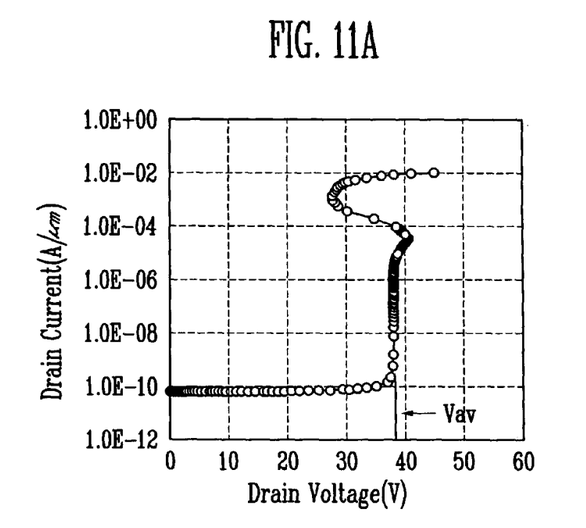
FIGS. 11(a) and 11(b) is a voltage-current characteristic curve of the GG_TDDNMOS device according to the present invention.
Figure 11B:
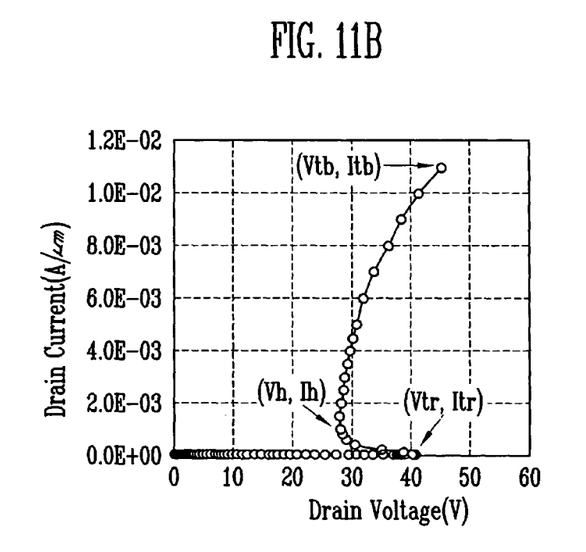

FIGS. 11(a) and 11(b) shows a typical voltage-current characteristic when the GG_TDDNMOS device according to the present invention operates as a device for ESD protection. The GG_TDDNMOS device implements a current-voltage characteristic, which has significantly improved the problems of an existing GG_DDDNMOS device. The content of the improvements can be described in detail as follows.

(1) The avalanche breakdown voltage of the GG_TDDN-MOS device is dependent upon only the ion implant condition for forming the drain drift region 206 in the same manner as the GG_DDDNMOS device. That is, it is not influenced by the ion implant condition for forming the impurity region 208. Accordingly, the GG_TDDNMOS device can cope with various and high operating voltages in the same manner as the GG_DDDNMOS device.

(2) The GG_TDDNMOS device can digest a sufficient large amount of stress current. That is, it can digest stress current, which is 3 times greater than that of an existing GG_DDDNMOS device (Itb≤12 mA/μm).

(3) The GG_TDDNMOS device has a thermal breakdown voltage higher than a BJT triggering voltage (Vtr≤Vtb). Therefore, if a multi-finger structure is formed, each finger can operate uniformly.

As a result, it was found that the ESD protection device employing the GG_TDDNMOS device represents a stable and good ESD protection performance compared to an existing GG_DDDNMOS device.

Figure 12:
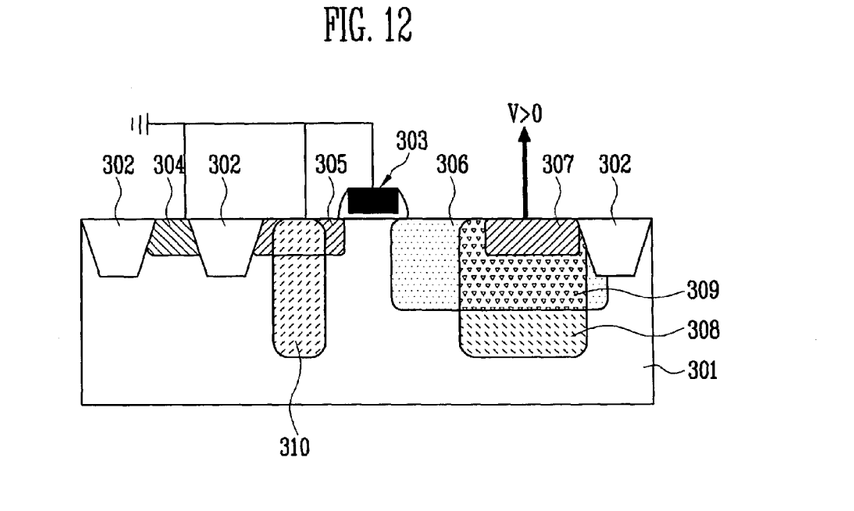
FIG. 12 shows the construction of the GG_TDDNMOS device according to another embodiment of the present invention.

An ESD protection device, as another embodiment other than the GG_TDDNMOS device in which the impurity region is formed in the drain region, is shown in FIG. 12. In another embodiment of the present invention, an impurity region 310 is formed even in the source by means of the same implant concentration and implant energy as those of the impurity region 308 formed in the drain. It is required that the impurity region 310 formed in the source does not exceed the source active region 305. If the impurity region 310 is formed even in the source as such, the current path of the U shape can be made more stably in the depth direction of the device.

Figure 13:
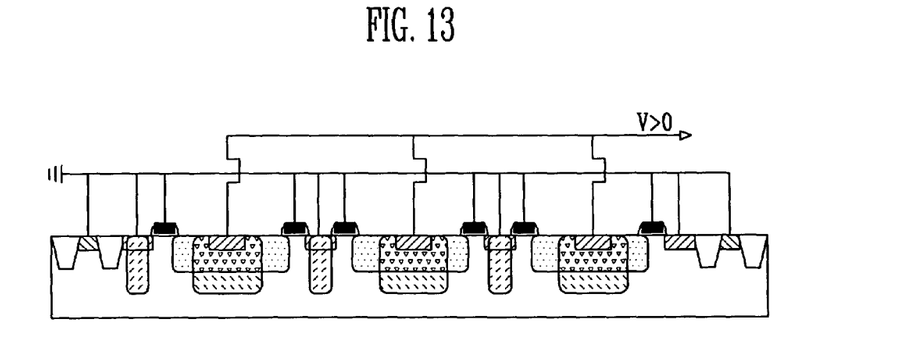
FIG. 13 shows a multi-finger structure of the GG_TDDNMOS device according to another embodiment of the present invention.

FIG. 13 shows a multi-finger structure of a GG_TDDN-MOS device in which impurity regions 308 and 310 are formed in a drain region and a source region, respectively according to another embodiment of the present invention.

As described above, according to the present invention, if a device for ESD protection is implemented by employing a GG_TDDNMOS device in which an impurity region is formed in a drain region, the following effects can be obtained.

(1) It is possible to implement a stable and good ESD protection performance compared to an existing GG_DDD-NMOS device.

(2) When an existing GG_DDDNMOS device operates as a device for ESD protection, it is possible to prevent stress current from being concentrated on the surface of the device. As such, if the stress current is not concentrated on the surface of the device for ESD protection but is uniformly distributed over the entire device, the device for ESD protection can digest more stress current when ESD stress is introduced.

(3) The GG_TDDNMOS device has a thermal breakdown voltage higher than a BJT triggering voltage (Vtr≤Vtb). Accordingly, when a multi-finger structure is formed by using the GG_TDDNMOS device, each finger can operate uniformly.

(4) If the ESD protection device having high efficiency against the stress current is applied to a protection circuit as such, a competitive force of a product can be increased since the overall size of a microchip can be reduced.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A microchip comprising an ESD protection device for protecting the microchip from electrostatic discharge damage, the ESD protection device having a thermal breakdown voltage and a BJT triggering voltage, the ESD protection device comprising:
 a semiconductor substrate;
 a plurality of isolation regions formed over the semiconductor substrate along a length direction of the semiconductor substrate;
 a gate formed over the semiconductor substrate;
 a drain formed adjacent to the gate, the drain comprising:
  a drain active region formed a first predetermined distance apart from a sidewall of the gate facing the drain active region, the drain active region having a first impurity ion concentration;
  a drain drift region formed adjacent to the sidewall of the gate or extending to the sidewall, the drain drift region having a second impurity ion concentration; and
  a drain impurity region formed a second predetermined distance apart from the sidewall of the gate along the length direction, the drain impurity region having a thickness that is greater than the thickness of the drain drift region and having a third impurity ion concentration; and
 a source formed on an opposite side of the gate from the drain,
 wherein the gate and the source are connected to a ground line, and the drain active region is connected to a power line or an I/O pad, and the thermal breakdown voltage is higher than the BJT triggering voltage.

2. The microchip of claim 1, wherein:
 the drain active region is implanted with an N-type impurity;
 the drain drift region is implanted with an N-type impurity with an energy that is greater than an energy with which the N-type impurity of the drain active region is implanted; and
 the drain impurity region is implanted with an N-type impurity with an energy that is greater than the energy with which the N-type impurity of the drain drift region is implanted.

3. The microchip of claim 1, wherein the source of the ESD protection device comprises a source active region adjacent to a sidewall of the gate opposite to the sidewall facing the drain active region, the source active region being implanted with impurity ions having a concentration that equals to the first impurity ion concentration.

4. The microchip of claim 3, wherein the source of the ESD protection device further comprises a source impurity region formed a third predetermined distance apart from the other one of the sidewalls of the gate, the source impurity region being partially overlapped with the source active region and having a depth that is greater than a depth of the source active region.

5. The microchip of claim 4, wherein a width of the source impurity region is less than a width of the source active region.

6. The microchip of claim 4, the ESD protection device further comprises
a well pick-up region isolated by and formed between two of the isolation regions, the well pick-up region comprising: an upper surface that is substantially coplanar with an upper surface of the semiconductor substrate, an upper surface of each of the isolation regions, and an upper surface of the source active region; and a thickness that is less than the thickness of the source impurity region.

7. The microchip of claim 3, wherein the source active region comprises an upper surface that is substantially coplanar with an upper surface of the semiconductor substrate and an upper surface of each of the isolation regions.

8. The microchip of claim 1, wherein an impurity concentration of an edge of the drain drift region is not changed due to diffused impurity of the drain impurity region in a thermal drive-in process regarding a direction where the gate is formed.

9. The microchip of claim 1, wherein at least a portion of the drain drift region and at least a portion of the drain impurity region form an overlapping region, the overlapping region having a fourth impurity ion concentration.

10. The microchip of claim 1, wherein a current path is provided in a vertical direction and configured to prevent a thermal breakdown in a silicon layer surface in the ESD protection device.

11. The microchip of claim 10, wherein the current path is further configured to cause the thermal breakdown to occur inside the silicon layer and not on the silicon layer surface.

12. The microchip of claim 1, wherein the drain drift region has a depth in the semiconductor substrate that is greater than a depth in the semiconductor substrate of the isolation regions.

13. The microchip of claim 1, wherein the drain of the ESD protection device is configured such that, when a voltage greater than an avalanche voltage of the ESD protection device is applied to the drain, a highest temperature region in the drain due to a current generated from the voltage is located in the drain impurity region below the drain active region.

14. An ESD protection device having a thermal breakdown voltage and a BJT triggering voltage, comprising:
a semiconductor substrate;
a gate formed over the semiconductor substrate;
a drain formed adjacent to the gate, the drain comprising:
a drain active region formed a first predetermined distance apart from a sidewall of the gate facing the drain active region, the drain active region having a first impurity ion concentration;
a drain drift region formed adjacent to the sidewall of the gate, the drain drift region having a second impurity ion concentration; and
a drain impurity region formed a second predetermined distance apart from the sidewall of the gate, the drain impurity region having a thickness that is greater than a thickness of the drain drift region and having a third impurity ion concentration; and
a source formed on an opposite side of the gate from the drain, the source having a thickness that is less than a thickness of the drain impurity region,
wherein the gate and the source are connected to a ground line, and the drain active region is connected to a power line or an I/O pad, and wherein the thermal breakdown voltage is higher than the BJT triggering voltage.

15. The device of claim 14, wherein the source comprises a source active region formed adjacent to a sidewall of the gate opposite the sidewall facing the drain active region, the source active region being implanted with impurity ions having a concentration that equals to the first impurity ion concentration.

16. The device of claim 15, further comprising:
a plurality of isolation regions formed over the semiconductor substrate, each of the isolation regions comprising an upper surface that is substantially coplanar with an upper surface of the source active region; and
a well pick-up region isolated by and formed between two of the isolation regions, the well pick-up region being connected to a ground line.

17. The device of claim 16, wherein the source active region of the source is connected to the ground line.

18. The device of claim 14, further comprising a plurality of isolation regions formed over the semiconductor substrate, wherein the drain drift region has a depth in the semiconductor substrate that is greater than a depth in the semiconductor substrate of the isolation regions.

19. The ESD protection device of claim 14, wherein the drain of the ESD protection device is configured such that, when a voltage greater than an avalanche voltage of the ESD protection device is applied to the drain, a highest temperature region in the drain due to a current generated from the voltage is located in the drain impurity region below the drain active region.

20. A semiconductor device having a thermal breakdown voltage and a BJT triggering voltage, comprising:
a semiconductor substrate;
a well pick-up region formed in the semiconductor substrate;
a plurality of isolation regions provided along a length direction of the semiconductor substrate;
a gate formed over the semiconductor substrate; and
a drain adjacent to the gate, the drain comprising:
a drain active region spaced apart from the gate along the length direction and having a first impurity ion concentration;
a drain drift region having a second impurity ion concentration and having a thickness that is greater than a thickness of the drain active region; and
a drain impurity region spaced apart from the gate along the length direction and having a third impurity ion concentration; and
a source provided at an opposite side of the gate from the drain, the source comprising:
a source active region having a fourth impurity ion concentration; and
a source impurity region spaced apart from the gate along the length direction and having a fifth impurity ion concentration,
wherein a width of the source impurity region along the length direction is less than a width of the drain impurity region; the gate and the source are connected to a ground line; the drain active region is connected to a power line or an I/O pad; and the thermal breakdown voltage is higher than the BJT triggering voltage.

21. The semiconductor device of claim 20, wherein the gate, the well pick-up region, and the source active region are commonly connected to the ground line.

22. The semiconductor device of claim 20, wherein the source has a double diffused structure; and the fourth impurity ion concentration is greater than the fifth impurity ion concentration.

23. The semiconductor device of claim 20, wherein the well pick-up region is formed between two of the isolation regions, the well pick-up region comprising an upper surface that is substantially coplanar with upper surfaces of the two isolation regions and an upper surface of the source active region.

24. The semiconductor device of claim 20, further comprising:
   a second gate; and
   a second drain adjacent to the second gate, the second drain comprising:
      a second drain active region spaced apart from the gate along the length direction and having a sixth impurity ion concentration;
      a second drain drift region having a seventh impurity ion concentration and having a thickness that is greater than a thickness of the second drain active region; and
      a second drain impurity region spaced apart from the second gate along the length direction and having an eighth impurity ion concentration; and
   a second source provide at an opposite side of the second gate from the second drain, the source comprising:
      a second source active region having a ninth impurity ion concentration; and
      a second source impurity region spaced apart from the second gate along the length direction and having a tenth impurity ion concentration,
   wherein a width of the second source impurity region along the length direction is less than a width of the second drain impurity region.

25. A semiconductor device for ESD protection having a thermal breakdown voltage and a BJT triggering voltage and having a multi-finger structure, the device comprising:
   a semiconductor substrate;
   a plurality of gates provided along a length direction of the semiconductor substrate; and
   a plurality of drains provided along the length direction, each of the drains comprising:
      a drain active region spaced apart from a corresponding gate along the length direction;
      a drain drift region having a thickness that is greater than a thickness of the drain active region; and
      a drain impurity region spaced apart from the corresponding gate along the length direction; and
   a plurality of sources provided along the length direction,
   wherein each of the sources is disposed on an opposite side of a gate from a corresponding drain, and each of the sources has a width along the length direction that is less than the drain drift region of the corresponding drain;
   the gates and the sources are connected to a ground line, and the drain active region is connected to a power line or an I/O pad;
   and the thermal breakdown voltage is higher than the BJT triggering voltage.

26. The semiconductor device for ESD protection of claim 25, further comprising:
   a plurality of isolation regions formed in the semiconductor substrate;
   a well pick-up region formed between two of the isolation regions,
   wherein the well pick-up region is provided at an outer periphery of the gates, the sources, and the drains.

27. The semiconductor device for ESD protection of claim 25, wherein each of the sources comprises:
   a source active region; and
   a source impurity region spaced apart from the corresponding gate,
   wherein a width of the source impurity region along the length direction is less than a width of the drain impurity region.

* * * * *